United States Patent
Kates

(10) Patent No.: US 8,019,105 B2
(45) Date of Patent: Sep. 13, 2011

(54) HEARING AID WITH ADAPTIVE COMPRESSOR TIME CONSTANTS

(75) Inventor: James Mitchell Kates, Niwot, CO (US)

(73) Assignee: GN Resound A/S (DK)

( * ) Notice: Subject to any disclaimer, the term of this patent is extended or adjusted under 35 U.S.C. 154(b) by 1268 days.

(21) Appl. No.: 11/393,360

(22) Filed: Mar. 29, 2006

(65) Prior Publication Data

US 2006/0233408 A1    Oct. 19, 2006

Related U.S. Application Data

(60) Provisional application No. 60/666,088, filed on Mar. 29, 2005.

(51) Int. Cl.
    *H04R 25/00*    (2006.01)
(52) U.S. Cl. ............... 381/321; 381/106; 381/107
(58) Field of Classification Search ......... 381/106–108, 381/320–321
    See application file for complete search history.

(56) References Cited

U.S. PATENT DOCUMENTS

| | | | |
|---|---|---|---|
| 4,718,099 A | | 1/1988 | Hotvet |
| 4,718,099 A | | 1/1988 | Hotvet |
| 5,255,325 A | * | 10/1993 | Ishimitsu et al. ............ 381/106 |
| 5,402,498 A | * | 3/1995 | Waller, Jr. ...................... 381/106 |
| 5,444,788 A | * | 8/1995 | Orban ............................. 381/106 |
| 5,771,299 A | * | 6/1998 | Melanson ....................... 381/316 |
| 6,240,192 B1 | * | 5/2001 | Brennan et al. ................ 381/314 |
| 6,628,795 B1 | * | 9/2003 | Ludvigsen ..................... 381/321 |
| 6,757,396 B1 | * | 6/2004 | Allred ............................ 381/106 |
| 7,212,640 B2 | * | 5/2007 | Bizjak ............................ 381/106 |
| 7,333,623 B2 | * | 2/2008 | Neumann ....................... 381/312 |

FOREIGN PATENT DOCUMENTS

| | | |
|---|---|---|
| EP | 1 448 022 A1 | 8/2004 |
| WO | WO 03/081947 A1 | 10/2003 |

OTHER PUBLICATIONS

International Search Report mailed on Jul. 25, 2006 for related PCT application PCT/DK2006/000168.

* cited by examiner

*Primary Examiner* — Curtis Kuntz
*Assistant Examiner* — Ryan Robinson
(74) *Attorney, Agent, or Firm* — Vista IP Law Group, LLP

(57) ABSTRACT

A hearing aid includes a microphone for conversion of sound into an input audiosignal, a signal processor for processing the input audiosignal, the signal processor including a compressor, and a receiver for conversion of the processed signal into sound, wherein the compressor is configured to adapt attack and release time constants in response to input signal fluctuations.

19 Claims, 6 Drawing Sheets

HEARING AID WITH ADAPTIVE COMPRESSOR TIME CONSTANTS

RELATED APPLICATION DATA

This application claims priority to and the benefit of U.S. Provisional Patent Application No. 60/666,088, filed on Mar. 29, 2005.

FIELD

The present application relates to a hearing aid with a compressor with adaptive time constants whereby compression modulation distortion is reduced.

BACKGROUND

In dynamic-range compression, the input signal is multiplied by a time-varying gain. The gain fluctuations introduce distortion, which may be audible for input signals such as white Gaussian noise.

Dynamic-range compression uses estimates of the signal level to control a time-varying multiplicative gain applied to the signal. The objective is to provide larger amounts of amplification to sounds at low intensities and reduced amplification to more-intense sounds. A digital compressor typically operates on the signal in a multiplicity of frequency bands, with independent gains computed for each band. The gains are normally controlled by the output of a peak detector, and the temporal dynamics of the compressor are thus specified by the peak-detector attack and release times.

Because the compressor provides a multiplicative gain, it is a form of amplitude modulation. Compression thus creates distortion side-bands that may be audible under some listening conditions. The more rapidly the gain varies over time, the greater the magnitude of the sidebands and the greater the probability that the modulation will produce audible processing artifacts. Thus increasing the compression ratio or reducing the attack and release times will increase the amount of perceptible distortion.

An additional concern in a system using block processing is that the compressor gain changes do not occur smoothly over time but rather jump in value at the processing block boundaries. Thus there is a discontinuity in the gain values that occurs at a periodic rate related to the processing block size. For a block of 24 samples at a 16-kHz sampling rate, there will be a basic periodicity at 667 Hz that will also generate distortion. Smoothing the gain over the duration of the processing block can remove the discontinuities, but is impractical in a digital hearing aid. Low-pass filtering the gain values can also reduce the discontinuities, but at the expense of increasing the compression overshoot and reducing the ability of the hearing aid to quickly respond to sudden increases in the input sound level.

There have recently been reports of audible compression modulation distortion in known compressors, and simulations have demonstrated audible modulation distortion. These compression systems use ANSI attack times of 5 ms and ANSI release times of 70 ms (125 ms in the lowest frequency band). Longer attack and release times would reduce the amount of audible distortion, but would increase the compression overshoot. There is thus a need for a compression algorithm that reduces the audible modulation noise while preserving the ability to quickly reduce the gain for sudden increases in the input signal level.

An example of a hearing aid with a compressor is disclosed in EP 1 448 022.

SUMMARY

It is an object to provide a hearing aid wherein compression modulation distortion is reduced without noticeably affecting the syllabic compressor behavior for speech.

According to some embodiments, the above-mentioned and other objects are fulfilled by a hearing aid comprising a microphone for conversion of sound into an input audiosignal, a signal processor for processing the input audiosignal, the signal processor including a compressor, a receiver for conversion of the processed signal into sound, and wherein the compressor adapts the attack and release time constants in response to input signal fluctuations or variations. In one embodiment, increases in the input signal level above the average signal level lead to decreased attack and release time constants.

Attack and release time constants may be adjusted in response to the difference between the power spectrum of the input audiosignal and the average signal spectrum.

In some embodiments, the attack and release times depend on the difference between the power spectrum for the current processing block and the smoothed peak detector output used to control the compressor. Long attack and release times are selected for small differences, and short attack and release times are selected for large differences. The resultant adaptive attack and release times are simple to implement and do not affect the compressor input/output characteristic.

It is an advantage that known compression input/output rules currently being used in known hearing aids may still be used with the sole modification that the attack and release time constants are adapted in response to the input signal behavior. Small signal fluctuations would cause the system to use long time constants, thus reducing the gain fluctuations and the resultant modulation distortion. Large increases in the signal level from one block to the next, however, would force the system to use short time constants, thus guaranteeing a fast reaction and the desired rapid reduction in system gain.

BRIEF DESCRIPTION OF THE DRAWINGS

Below, the embodiments will be further described and illustrated with reference to the accompanying drawings in which.

DETAILED DESCRIPTION OF EMBODIMENTS

Figure 1:
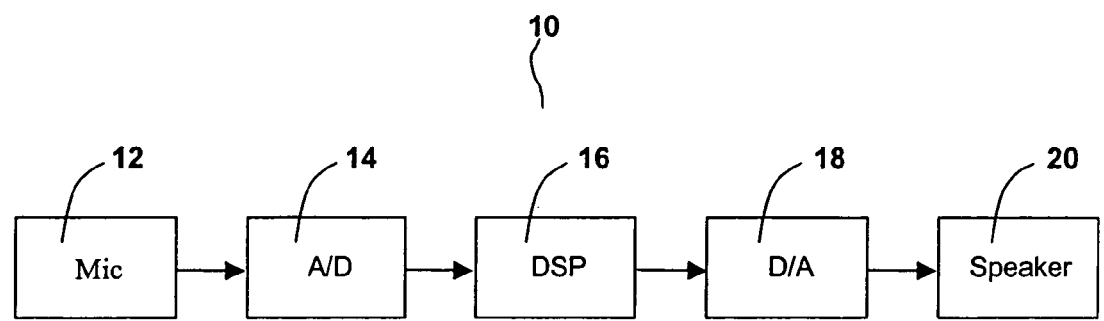
FIG. 1 is a general block diagram of a hearing aid.

FIG. 1 is a simplified block diagram of a digital hearing aid 10. The hearing aid comprises an input transducer 12, preferably a microphone, an analogue-to-digital (AID) converter 14, a signal processor 16 (e.g. a digital signal processor or DSP), a digital-to-analogue (D/A) converter 18, and an output transducer 20, preferably a receiver. In operation, input transducer 12 receives acoustical sound signals and converts the signals to analogue electrical signals. The analogue electrical signals are converted by A/D converter 14 into digital electrical signals that are subsequently processed by DSP 16 to form a digital output signal. The digital output signal is converted by D/A converter 18 into an analogue electrical signal. The analogue signal is used 25 by output transducer 20, e.g., a receiver, to produce an audio signal that is heard by the user of the hearing aid 10.

Figure 2:
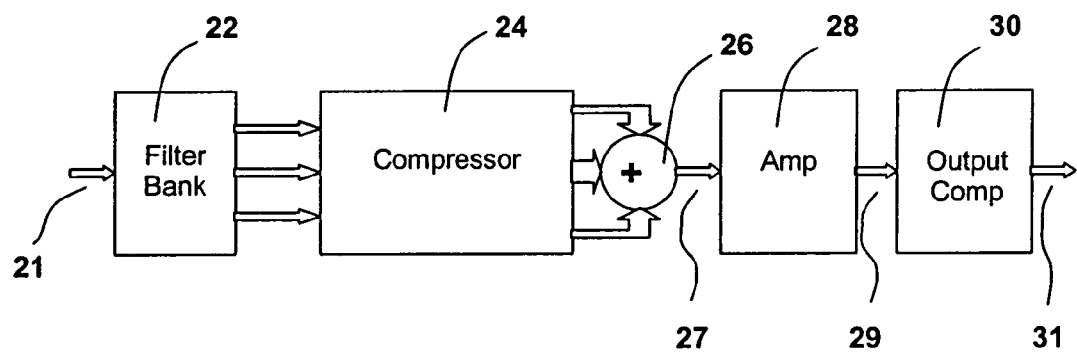
FIG. 2 is a block diagram of one embodiment.
Figure 3:
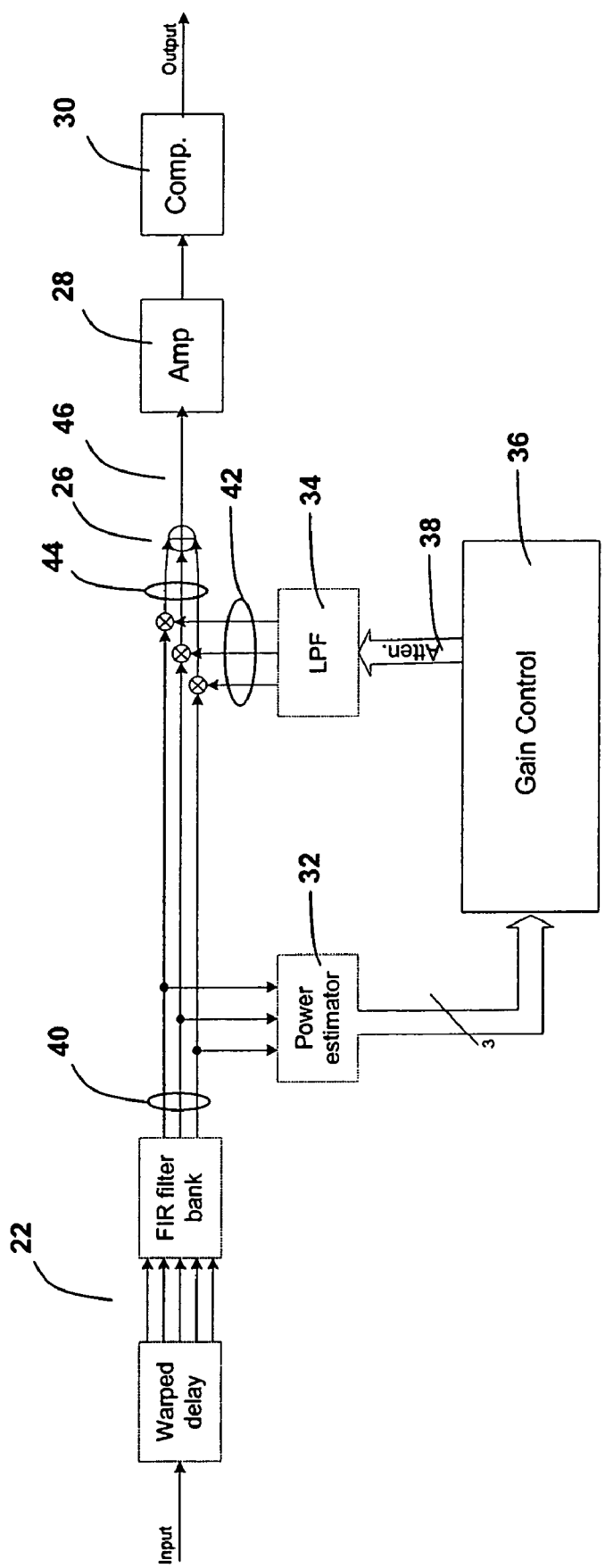
FIG. 3 is a more detailed block diagram of the embodiment shown in FIG. 2.

FIGS. 2 and 3 show parts of the signal processor 16 in more detail. FIGS. 1-3 are identical to FIGS. 1-3 of EP 1 448 022, however, the present illustrated compressor has adaptive attack and release time constants in accordance with some embodiments. In the embodiment illustrated in FIG. 2 and more detailed in FIG. 3, the hearing aid comprises a multi-channel compressor 22, 24, 26 with a digital input 21 for inputting a digital sound signal, and an output 27 connected to an amplifier 28 with a selectable static gain in each of its frequency channels for compensation of an individual hearing loss and connected to an output compressor 30 for limitation of the output 31 power of the hearing aid and connected to the output 29 of the amplifier 28.

In the illustrated embodiment, the output compressor 30 is a single-channel output compressor 30.

As illustrated in FIG. 3, the filter bank 22 comprises warped filters providing adjustable crossover frequencies, which are adjusted to provide the desired response in accordance with the users hearing impairment. The filters are 5-tap cosine-modulated filters.

Normally FIR filters work on a tapped delay line with one sample delay between the taps. By replacing the delays with first order all-pass filters, frequency warping is achieved enabling adjustment of crossover frequencies. The warped delay unit has five outputs. The five outputs constitutes a vector $w=[W_0\ W_1\ W_2\ W_3\ W_4]^T$ at a given point in time, which is led into the filter bank where the three channel output y, is formed. The filter bank is defined by:

$$B = \begin{bmatrix} b_0 & b_1 & b_2 & b_1 & b_0 \\ -2b_0 & 0 & 2b_2 & 0 & -2b_0 \\ b_0 & -b_1 & b_2 & -b_1 & b_0 \end{bmatrix}$$

The output of the filter bank y is:

y=Bw

The vector y contains the channel signals.

The choice of filter coefficients is a trade-off between stop-band attenuation in the low and high frequency channels, and stop-band attenuation in the middle channel. The higher attenuation in the low and high frequency channels, the lower attenuation in the middle channel.

The multi-channel compressor further comprises a multi-channel power estimator 32 for calculation of the sound level or power in each of the frequency channels of the filter bank 22. The calculated values are applied to the multi-channel compressor gain control unit 36 for determination of a compressor channel gain to be applied to the signal output 40 of each of the filters of the filter bank 22.

The compressor gains 38 are calculated and applied batch-wise for a block of samples whereby required processor power is diminished. When the compressor operates on blocks of signal samples, the compressor gain control unit 36 operates at a lower sample frequency than other parts of the system. This means that the compressor gains only change every N'th sample where N is the number of samples in the block. Probable artefacts caused by fast changing gain values are suppressed by three low-pass filters 34 at the gain outputs 38 of the compressor 5 gain control unit 36 for smoothing gain changes at block boundaries.

The output signals 40 from the filter bank 22 are multiplied with the corresponding individual low-pass filtered gain outputs 42 of the compressor gain control unit 36, and the resulting signals 44 are added 26 to form the compressed signal 46 that is input to the amplifier 28. The compressor provides attenuation only, i.e. the three compressors provide the difference 10 between the desired gains for soft sounds and the desired gains for loud sounds.

The amplifier 28 provides frequency shaping that forms the desired gain for soft sounds, i.e. it compensates the frequency dependent part of the hearing impairment in question. The amplifier 28 has minimum-phase FIR filters with a suitable order. Minimum-phase filters guarantee minimum group delay in the system. The filter parameters are determined when the system is 15 fitted to a patient and does not change during operation. The design process for minimum-phase filters is well known. The hearing loss compensation and the dynamic compression may take place in different frequency bands, where the term different frequency bands means different number of frequency bands and/or frequency bands with different bandwidth and/or crossover frequency.

Let B(m,k) be the input signal level measured for input block m and frequency band k, and let P(m,k) be the peak-detector output. The general algorithm for the peak detector is to use a fast attack time and a slower release time, giving $$\text{If } B(m,k) > P(m,k),\ P(m,k) = \alpha(k)P(m-1,k) + [1-\alpha(k)]B(m,k)\ \text{Else}\ P(m,k) = \beta(k)P(m-1,k) + [1-\beta(k)]B(m,k) \quad (1)$$

Where $\beta(k) > \alpha(k)$, and $\alpha(k) < 1$ and $\beta(k) < 1$.

For syllabic compression, the ANSI attack time is 5 ms and the release time is 70 ms (125 ms in the lowest frequency band).

The adaptive time constants vary with the difference between the block signal power B(m,k) and the peak-detected power P(m,k). Let Bdb(m,k) be the block signal power converted to dB, and 30 Pdb(m,k) be the peak detected power converted to dB. The basic algorithm is then $\theta_0 < \text{Bdb}(m,k) - \text{Pdb}(m-1,k)$ Short attack time
$0 < \text{Bdb}(m,k) - \text{Pdb}(m-1,k) \leq \theta_0$, Long attack time
$-\theta_1 < \text{Bdb}(m,k) - \text{Pdb}(m-1,k) \leq 0$, Long release time
$\text{Bdb}(m,k) - \text{Pdb}(m-1,k) \leq -\theta_1$, Short release time It has been found empirically that setting both the attack-time threshold 0, and the release-time threshold 0, to 10 dB yields good sound quality.

Figure 4:
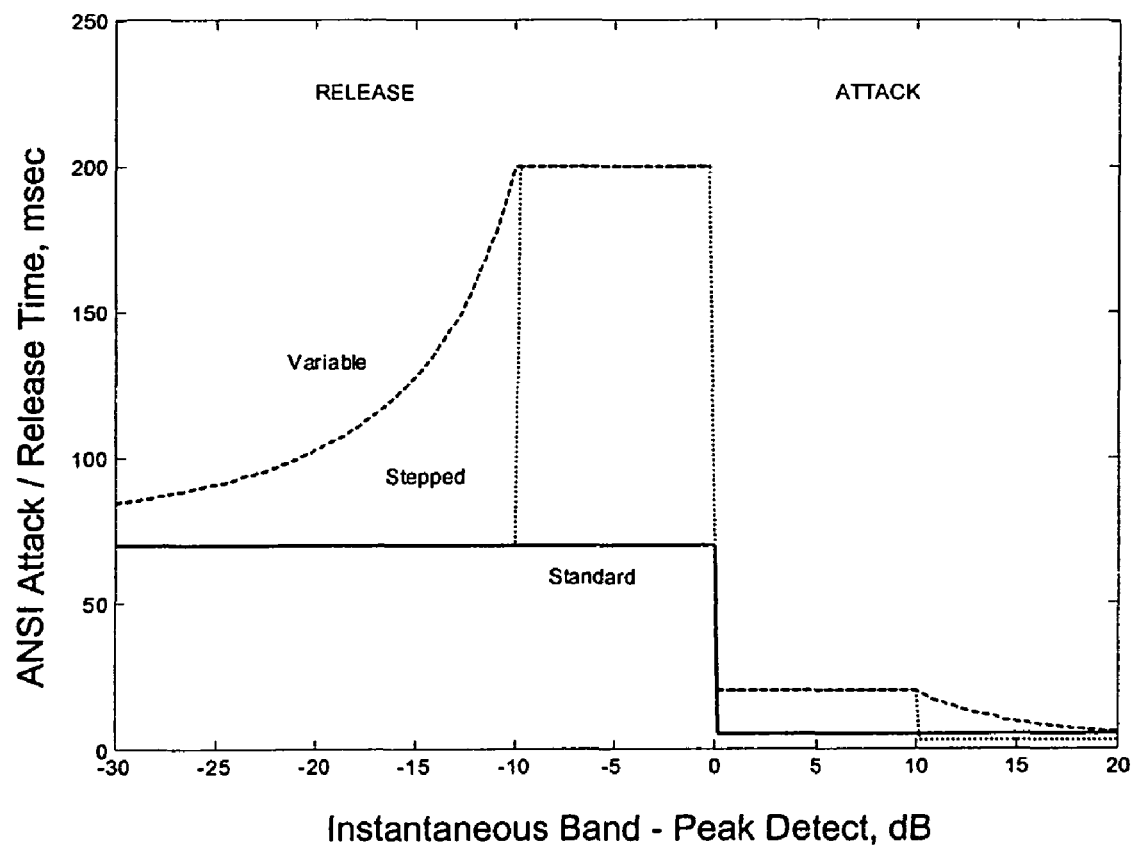
FIG. 4 shows a plot of ANSI attack and release times as a function of the difference in Db between the instantaneous band levels and the peak detector output.

The attack and release times for the standard and adaptive systems are shown in FIG. 4. The standard system, shown by the solid line, uses an attack time of 5 ms if the band power exceeds the peak-detected power, and a release time of 70 ms if the band power is less than the peak-detected power. A simple stepped adaptive time-constant system, shown by the dotted line in FIG. 4, uses one set of time constants if the band power is within 10 dB of the peak-detected power, and a different set of time constants otherwise. Thus if the band power is less 10 than 10 dB above the peak-detected power, the attack time is 20 ms. If the band power exceeds the peak-detected power by more than 10 dB, the attack time is reduced to 3 ms. Similarly, if the band power is less than 10 dB below the peak-detected power, the release time is 200 ms, and if the band power is more than 10 dB below the peak-detected power, the release time is reduced to 70 dB. These attack and release times can of course be modified given additional listening tests and subject evaluations.

An alternative to the stepped adaptive time constant is the continuously variable time constant. The objective is to smoothly vary the attack and release times as the difference between the band power and the peak-detected power increases. In the variable system, shown in FIG. 4 by the dashed line, the attack time becomes proportional to the square of the ratio of the peak-detected power to the band power for differences that exceed 10 dB. If the band power exceeds the peak-detected power by less than 10 dB, a fixed attack time of 20 ms is used. If the band power is less than 10 dB below the peak-detected power, a fixed release time of 200 ms is used.

Simulation Results

The compressor was used with a block size of 24 samples at a 16-kHz sampling rate, and the frequency-warping allpass filter parameter was set to 0.5. The compression parameters for the compressor are indicated in Table 1.

TABLE 1

| Compression Parameter | Audiometric Frequency, Hz | | | | | |
|---|---|---|---|---|---|---|
| | 250 | 500 | 1000 | 2000 | 4000 | 6000 |
| ANSI Attack Time, ms | 5 | 5 | 5 | 5 | 5 | 5 |
| ANSI Release Time, ms | 125 | 70 | 70 | 70 | 70 | 70 |
| Compression Ratio | 2:1 | 2:1 | 2:1 | 2:1 | 2:1 | 2:1 |
| Lower Knee, dB SPL | 45 | 45 | 45 | 45 | 45 | 45 |
| Upper Knee, dB SPL | 100 | 100 | 100 | 100 | 100 | 100 |
| Gain, Input at 59 dB SPL | 0 | 0 | 10 | 15 | 30 | 30 |

Inputs below the lower knee receive linear gain, and inputs above the upper knee receive infinite compression (amplitude limiting). The gain as a function of frequency corresponds to settings for a high-frequency hearing loss, and represents conditions for which the modulation 5 distortion is most audible to a listener with normal hearing. The adaptive attack- and release-time systems replaced the fixed attack and release times with the stepped or continuously variable times shown in FIG. 4, and kept the remaining compression parameters unchanged from the standard system. The input signals were adjusted to have a level of 70 dB SPL, so the compression was engaged for the entire signal.

The compressor modulation distortion is most audible for a white noise input signal. The compression gains for the frequency band centered at 2840 Hz are plotted in FIG. 5 for a I-sec segment of the noise signal. The gain for the standard compressor using fixed attack and release times is shown by the bottom curve. The gain ranges from 13.7 to 16.4 dB, a spread of 2.7 dB. The offset curves for the adaptive attack and release times are plotted above the curve 15 for the standard compressor. The gain for the stepped attack and release time system ranges from 14.4 to 16.2 dB, a spread of 1.8 dB, and the gain for the continuously-variable attack and release time system ranges from 14.3 to 15.9 dB, a spread of 1.6 dB. In addition, the gain curves for the adaptive systems are much smoother than the curve for the standard system. Thus the adaptive systems provide much less modulation of the noise than the standard syllabic compressor.

The compressor modulation distortion is less audible for speech inputs. The speech signal used for illustration is a 5-second segment of the "Rainbow Passage" spoken by a male talker. [The complete "Rainbow Passage" can be found on page 127 of the 2nd edition of Grant Fairbanks' *Voice and Articulation Drillbook* (1960, pp. 124-139, New York: Harper & Row)]. The envelope of the speech is plotted in FIG. 6, where the syllabic energy variations are readily apparent. The gains for the different compression systems for this segment of speech are plotted in FIG. 7. The gain for the standard compressor is shown by the dash and dot curve that for the stepped adaptive system by the dotted curve, and the gain for the variable adaptive system by the solid curve. The longer time constants used in the adaptive compression systems for small variations in the signal level have only a small impact on the syllabic compression gains. The gains for the stepped system are nearly identical to those for the standard compressor. The longer release times of the continuously-variable system lead to somewhat slower increases in gain when the signal level drops.

The system with linear gain is the reference for the white noise input; we perceive white noise as a smooth continuous signal despite its envelope fluctuations, and that perception is preserved even with the high-frequency amplification provided for the simulated hearing loss. The modulation distortion for the standard compressor is audible as a subtle granularity superimposed on the smooth noise envelope. The granularity is much harder to hear for the adaptive systems. The modulation distortion is much harder to hear for the speech segment, and all three compression systems have a very similar sound quality.

FIG. 4 shows plots of ANSI attack and release times as a function of the difference in dB between the instantaneous band levels and the peak detector output. The solid line indicates the time constants of the known compressor, the dotted line indicates the stepped adaptive time constants, and the dashed line indicates the variable adaptive time constants.

Figure 5:
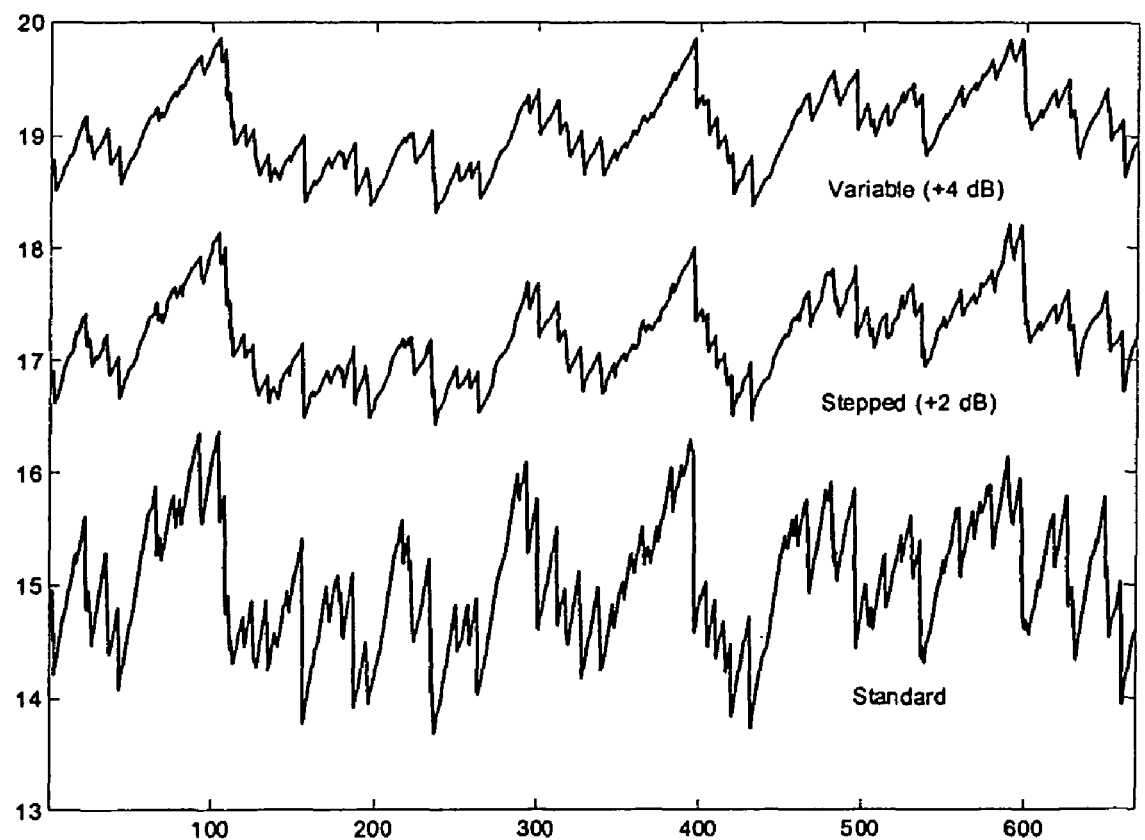
FIG. 5 shows plots of compressor gain as a function of time over 1 ms for white Gaussian noise and a simulated high-frequency hearing loss.

FIG. 5 shows plots of compressor gain as a function of time over 1 ms for white Gaussian noise and a simulated high-frequency hearing loss. The compression ratio is 2:1 and the gains are for the frequency band centered at 2840 Hz. The curve for the stepped adaptive time constants is offset by 2 dB, and the curve for the variable adaptive time constants is offset by 4 dB.

Figure 6:
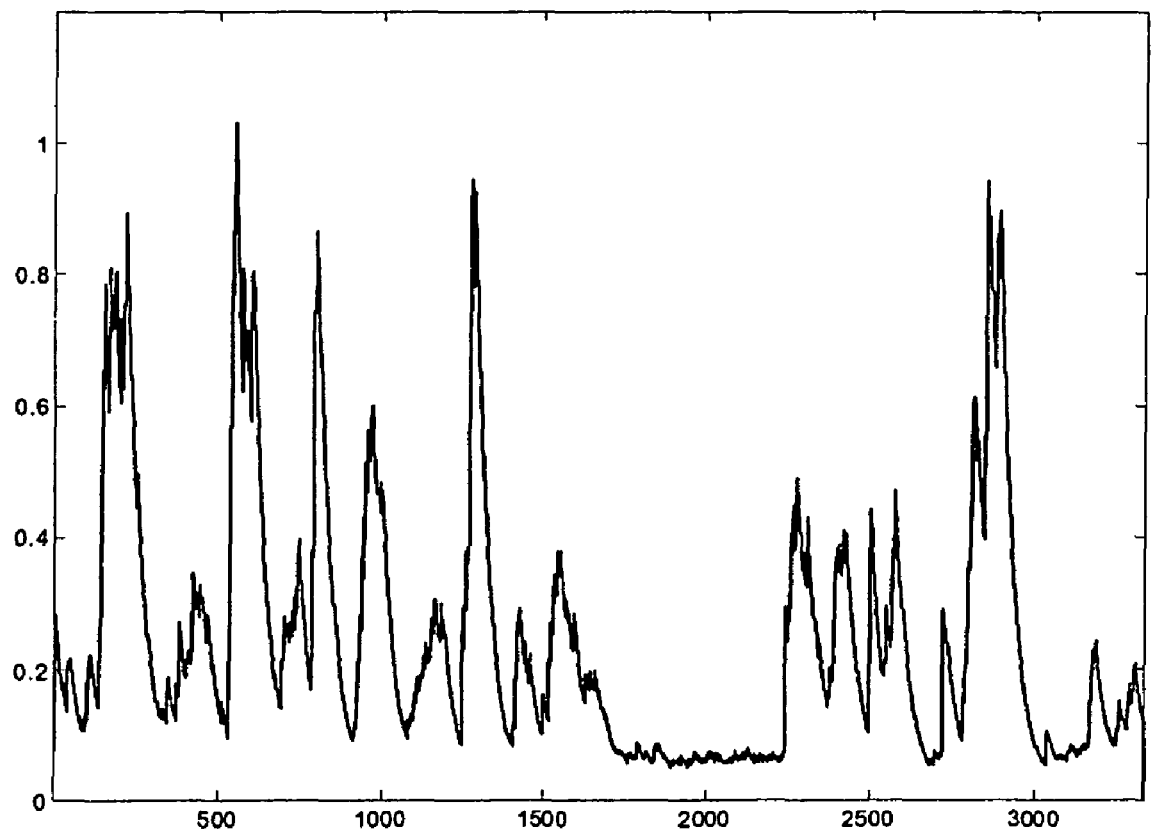
FIG. 6 shows a plot of peak-detected envelope for five seconds of a speech signal.

FIG. 6 shows a plot of peak-detected envelope for five seconds of a speech signal. The speech 30 is the "Rainbow Passage" spoken by a male talker.

Figure 7:
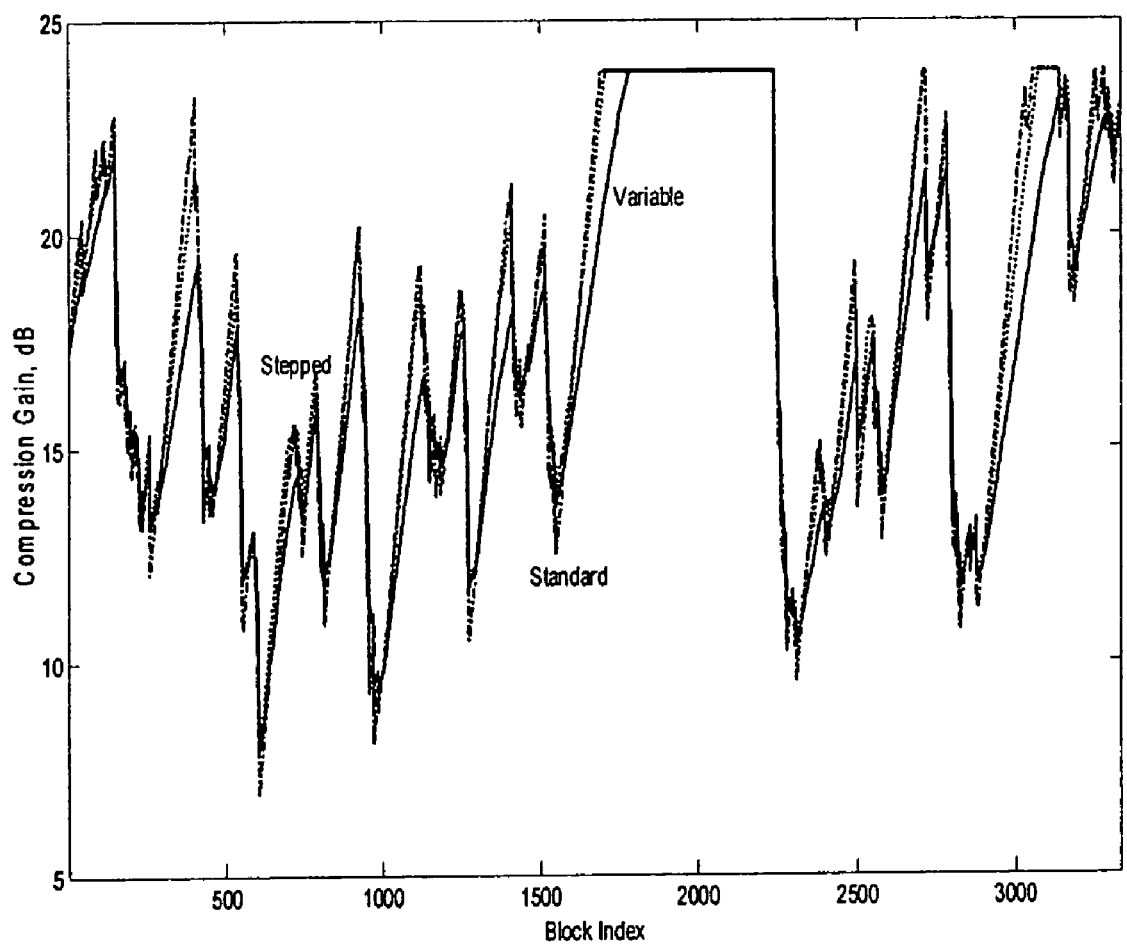
FIG. 7 shows plots of compressor gain as a function of time for 5 ms for the "Rainbow Passage" and a simulated high-frequency hearing loss.

FIG. 7 shows compressor gain as a function of time for 5 ms for the "Rainbow Passage" and a simulated high-frequency hearing loss. The compression ratio is 2:1 and the gains are for the frequency band centered at 2840 Hz. The curve for the stepped adaptive time constants is indicated by the dash and dot line, the curve for the stepped adaptive time constants is indicated by the dotted line, and the curve for the variable adaptive time constants is indicated by the solid line.

A syllabic compressor, with its fast attack and release times, can introduce audible modulation distortion for white Gaussian noise and other signals that have randomly fluctuating but statistically stationary envelopes. The envelope fluctuations for Gaussian noise generally fall within a range of +I0 to −10 dB from the average level. Longer attack and release times for signal envelope fluctuations that fall within this +I0 dB range reduce the audible modulation distortion introduced by the dynamic-range compression. However, the syllabic envelope fluctuations for speech in quiet are greater than the +I0 dB range observed for noise. Shorter attack and release times for envelope fluctuations that are greater than +I0 dB from the average level therefore allow the compressor to accurately track the speech.

The compressor using stepped adaptive attack and release times greatly reduces the modulation distortion for noise signals while preserving the syllabic compression behavior for speech. The continuously variable attack and release times give similar behavior to the stepped system, but are more complex computationally. The stepped adaptive attack and release times thus give a simple and effective solution to the problem of compressor modulation distortion without sacrificing the ability of the system to limit the output to sudden increases in sound level.

The invention claimed is:

1. A hearing aid comprising:
   a microphone for conversion of sound into an input audio signal;
   a signal processor for processing the input audio signal, the signal processor including a compressor; and
   a receiver for conversion of the processed signal into sound;
   wherein the compressor is configured to operate based on an attack time and a release time in response to input signal fluctuations, the attack time having a value that is different from a value of the release time;
   wherein the processor is configured to decrease the attack time in response to an increase in a level of the input audio signal that is above an average signal level.

2. The hearing aid according to claim 1, wherein the processor is configured to decrease the release time in response to an increase in a level of the input audio signal that is above an average signal level.

3. The hearing aid according to claim 1, wherein the processor is configured to adjust the attack time in response to a difference between a power spectrum of the input audio signal and an average signal spectrum.

4. The hearing aid according to claim 1, wherein the processor is configured to adjust the release time in response to a difference between a power spectrum of the input audio signal and an average signal spectrum.

5. A hearing aid comprising:
   a microphone for conversion of sound into an input audio signal;
   a signal processor for processing the input audio signal, the signal processor including a compressor; and
   a receiver for conversion of the processed signal into sound;
   wherein the compressor is configured to operate based on an attack time and a release time in response to input signal fluctuations, the attack time having a value that is different from a value of the release time;
   wherein the processor is configured to decrease the release time in response to an increase in a level of the input audio signal that is above an average signal level.

6. The hearing aid according to claim 1, wherein the attack time and the release time vary as a step function.

7. The hearing aid according to claim 1, wherein the attack time and the release time remain unchanged for signal variations below a certain level.

8. The hearing aid according to claim 1, wherein the processor comprises warped filters.

9. A hearing aid comprising:
   a microphone for conversion of sound into an input audio signal;
   a signal processor for processing the input audio signal, the signal processor including a compressor; and
   a receiver for conversion of the processed signal into sound;
   wherein the processor is configured to vary an attack time of the compressor as a function of a difference between an instantaneous band power of the input audio signal and a peak detected power of the input audio signal, and to vary a release time of the compressor as a function of the difference between the instantaneous band power and the peak detected power.

10. The hearing aid according to claim 9, wherein the attack time is different from the release time.

11. The hearing aid according to claim 9, wherein the compressor is configured to operate on blocks of at least two samples.

12. The hearing aid according to claim 11, wherein the compressor comprises gain outputs, and the hearing aid further comprises low-pass filters at the gain outputs of the compressor for smoothing gain changes at block boundaries.

13. The hearing aid according to claim 12, wherein the peak detected power comprises a smoothed peak detected power.

14. The hearing aid according to claim 9, wherein the attack time and the release time vary as a step function.

15. The hearing aid according to claim 9, wherein the attack time and the release time remain unchanged for signal variations below a certain level.

16. The hearing aid according to claim 9, wherein the processor comprises warped filters.

17. The hearing aid according to claim 5, wherein the attack time and the release time vary as a step function.

18. The hearing aid according to claim 5, wherein the attack time and the release time remain unchanged for signal variations below a certain level.

19. The hearing aid according to claim 5, wherein the processor comprises warped filters.

* * * * *

UNITED STATES PATENT AND TRADEMARK OFFICE
CERTIFICATE OF CORRECTION

| | | Page 1 of 1 |
|---|---|---|
| PATENT NO. | : 8,019,105 B2 | |
| APPLICATION NO. | : 11/393360 | |
| DATED | : September 13, 2011 | |
| INVENTOR(S) | : James Mitchell Kates | |

It is certified that error appears in the above-identified patent and that said Letters Patent is hereby corrected as shown below:

In the Specifications:

In column 3, line 31, "users" is changed to -- user's --.

In column 3, line 37, "constitutes" is changed to -- constitute --.

In column 4, line 26, "different frequency bands" is changed to -- "different frequency bands" --.

In the Claims:

In column 7, line 23, "an increase" is changed to -- a decrease --.

In column 7, line 23, "above" is changed to -- below --.

In column 7, line 45, "an increase" is changed to -- a decrease --.

In column 7, line 46, "above" is changed to -- below --.

Signed and Sealed this
Sixth Day of May, 2014

Michelle K. Lee
*Deputy Director of the United States Patent and Trademark Office*